(12) United States Patent
Joda et al.

(10) Patent No.: US 12,148,614 B2
(45) Date of Patent: Nov. 19, 2024

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Takuya Joda, Toyama (JP); Arito Ogawa, Toyama (JP); Norikazu Mizuno, Toyama (JP); Shogo Hayasaka, Toyama (JP); Koei Kuribayashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 483 days.

(21) Appl. No.: 17/478,523

(22) Filed: Sep. 17, 2021

(65) Prior Publication Data

US 2022/0093392 A1    Mar. 24, 2022

(30) Foreign Application Priority Data

Sep. 23, 2020    (JP) .................................. 2020-158209

(51) Int. Cl.
*H01L 21/02* (2006.01)
*C23C 16/455* (2006.01)
*C23C 16/458* (2006.01)

(52) U.S. Cl.
CPC .... *H01L 21/0262* (2013.01); *C23C 16/45561* (2013.01); *C23C 16/45563* (2013.01); *C23C 16/4584* (2013.01)

(58) Field of Classification Search
None
See application file for complete search history.

(56) References Cited

U.S. PATENT DOCUMENTS

2002/0110999 A1    8/2002  Lu et al.
2003/0214043 A1    11/2003 Saitoh et al.
(Continued)

FOREIGN PATENT DOCUMENTS

CN    104968426 A  * 10/2015  .............. B01J 8/008
JP    2002-289690 A    10/2002
(Continued)

OTHER PUBLICATIONS

Korean Office Action issued on Sep. 18, 2023 for Korean Patent Application No. 10-2021-0123054.
(Continued)

*Primary Examiner* — Michael Lebentritt
(74) *Attorney, Agent, or Firm* — Volpe Koenig

(57) ABSTRACT

Described herein is a technique capable of forming a flat film. According to one or more embodiments of the present disclosure, there is provided a technique that includes: (a) forming a first layer on a substrate by performing a first layer forming cycle once or more, wherein the first layer forming cycle includes: (a1) supplying a first element-containing gas to the substrate in a process chamber; and (a2) supplying a first reducing gas to the substrate a plurality of times, and wherein (a1) and (a2) are sequentially performed; and (b) forming a second layer on the first layer by performing a second layer forming cycle once or more after (a), wherein the second layer forming cycle includes: (b1) supplying a second element-containing gas to the substrate; and (b2) supplying a second reducing gas to the substrate, and wherein (b1) and (b2) are sequentially performed.

19 Claims, 7 Drawing Sheets

(56) References Cited

U.S. PATENT DOCUMENTS

| | | |
|---|---|---|
| 2008/0070017 A1 | 3/2008 | Yoshii et al. |
| 2012/0119337 A1 | 5/2012 | Sasaki et al. |
| 2013/0164936 A1 | 6/2013 | Oshimo et al. |
| 2014/0295667 A1 | 10/2014 | Kaga et al. |
| 2015/0206736 A1 | 7/2015 | Akae et al. |
| 2016/0365246 A1 | 12/2016 | Yamamoto et al. |
| 2019/0019673 A1 | 1/2019 | Ogawa et al. |
| 2020/0194269 A1 | 6/2020 | Ogawa et al. |
| 2022/0093404 A1* | 3/2022 | Ogawa .............. H01L 21/32051 |

FOREIGN PATENT DOCUMENTS

| | | | |
|---|---|---|---|
| JP | 2003-045960 A | | 2/2003 |
| JP | 2003-332426 A | | 11/2003 |
| JP | 2005-136192 A | | 5/2005 |
| JP | 2005-191290 A | | 7/2005 |
| JP | 2010238810 A | * | 10/2010 |
| JP | 2011-066263 A | | 3/2011 |
| JP | 2012-104720 A | | 5/2012 |
| JP | 2013-133521 A | | 7/2013 |
| JP | 2014-208883 A | | 11/2014 |
| JP | 2015-138913 A | | 7/2015 |
| KR | 10-1811531 B1 | | 12/2017 |
| WO | 2017/168600 A1 | | 10/2017 |
| WO | 2019/058608 A1 | | 3/2019 |

OTHER PUBLICATIONS

State Intellectual Property Office of the People's Republic of China, Notice of First Examination Opinion Issued on Aug. 31, 2023 for Chinese Patent Application No. 202111101803.2.
Singapore Written Opinion issued on Nov. 29, 2022 for Singapore Patent Application No. 10202110167T.
Japanese Office Action dated Sep. 30, 2022 for Japanese Patent Application No. 2020-158209.
Taiwan Office Action dated Aug. 24, 2022 for Taiwan Patent Application No. 110131448.
Taiwan Office Action issued on May 9, 2023 for Taiwan Patent Application No. 110131448.

* cited by examiner

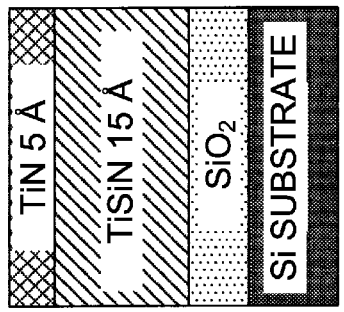
FIG. 8A
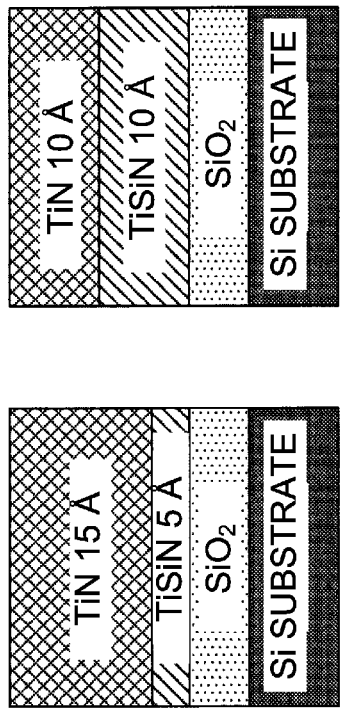
FIG. 8B  FIG. 8C  FIG. 8D
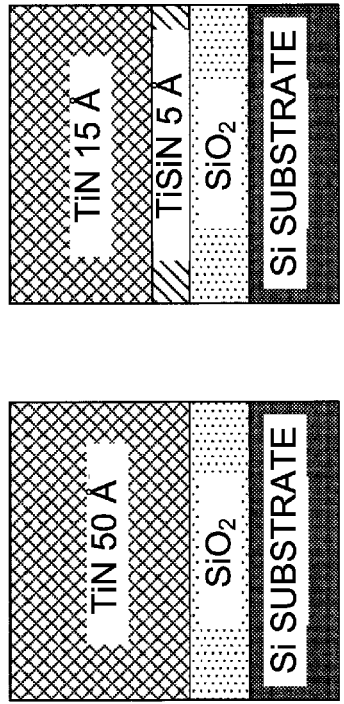
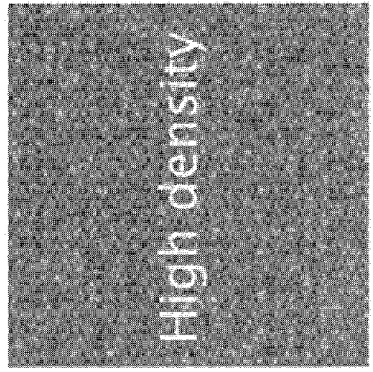
FIG. 8E
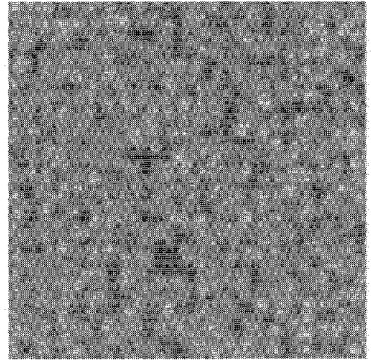
FIG. 8F
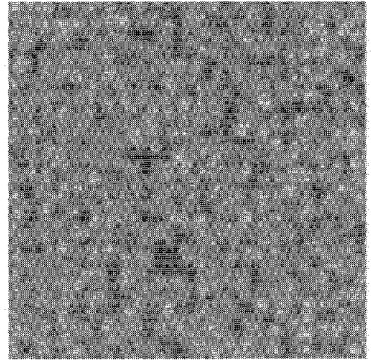
FIG. 8G
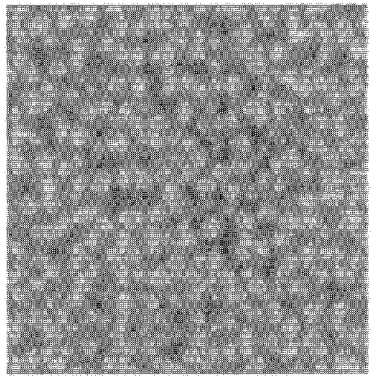
FIG. 8H

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2020-158209, filed on Sep. 23, 2020, in the Japanese Patent Office, the entire contents of which are hereby incorporated by reference.

BACKGROUND

1. Field

The present disclosure relates to a method of manufacturing a semiconductor device, a substrate processing apparatus and a non-transitory computer-readable recording medium.

2. Related Art

For example, a tungsten film (W film) whose resistance is low is used as a word line of a NAND flash memory or a DRAM of a three-dimensional structure. For example, according to some related arts, a titanium nitride film (TiN film) serving as a barrier film may be used between the W film and an insulating film. The TiN film serves to improve the adhesion between the W film and the insulating film, and the W film may be formed (grown) on the TiN film by a nucleating type film-forming.

However, an embedding width of a groove in which the W film is formed is small. Therefore, when the barrier film is not flat, a volume of the W film may decrease. Thereby, it may be difficult to reduce a resistance of the W film.

SUMMARY

Some embodiments of the present disclosure provide a technique capable of forming a sufficiently flat film.

According to one or more embodiments of the present disclosure, there is provided a technique that includes: (a) forming a first layer on a substrate by performing a first layer forming cycle once or more, wherein the first layer forming cycle includes: (a1) supplying a first element-containing gas to the substrate in a process chamber; and (a2) supplying a first reducing gas to the substrate a plurality of times, and wherein (a1) and (a2) are sequentially performed in the first layer forming cycle; and (b) forming a second layer on the first layer by performing a second layer forming cycle once or more after (a), wherein the second layer forming cycle includes: (b1) supplying a second element-containing gas to the substrate; and (b2) supplying a second reducing gas to the substrate, and wherein (b1) and (b2) are sequentially performed in the second layer forming cycle.

BRIEF DESCRIPTION OF THE DRAWINGS

FIGS. 8A through 8D are diagrams schematically illustrating cross-sections of silicon substrates when ratios of a TiN layer in the TiN film formed on the silicon substrates are 100%, 75%, 50% and 25%, respectively, and FIGS. 8E through 8H are diagrams schematically illustrating TEM images of the TiN films formed on the silicon substrates shown in FIGS. 8A through 8D, respectively.

DETAILED DESCRIPTION

Embodiments

Figure 1:
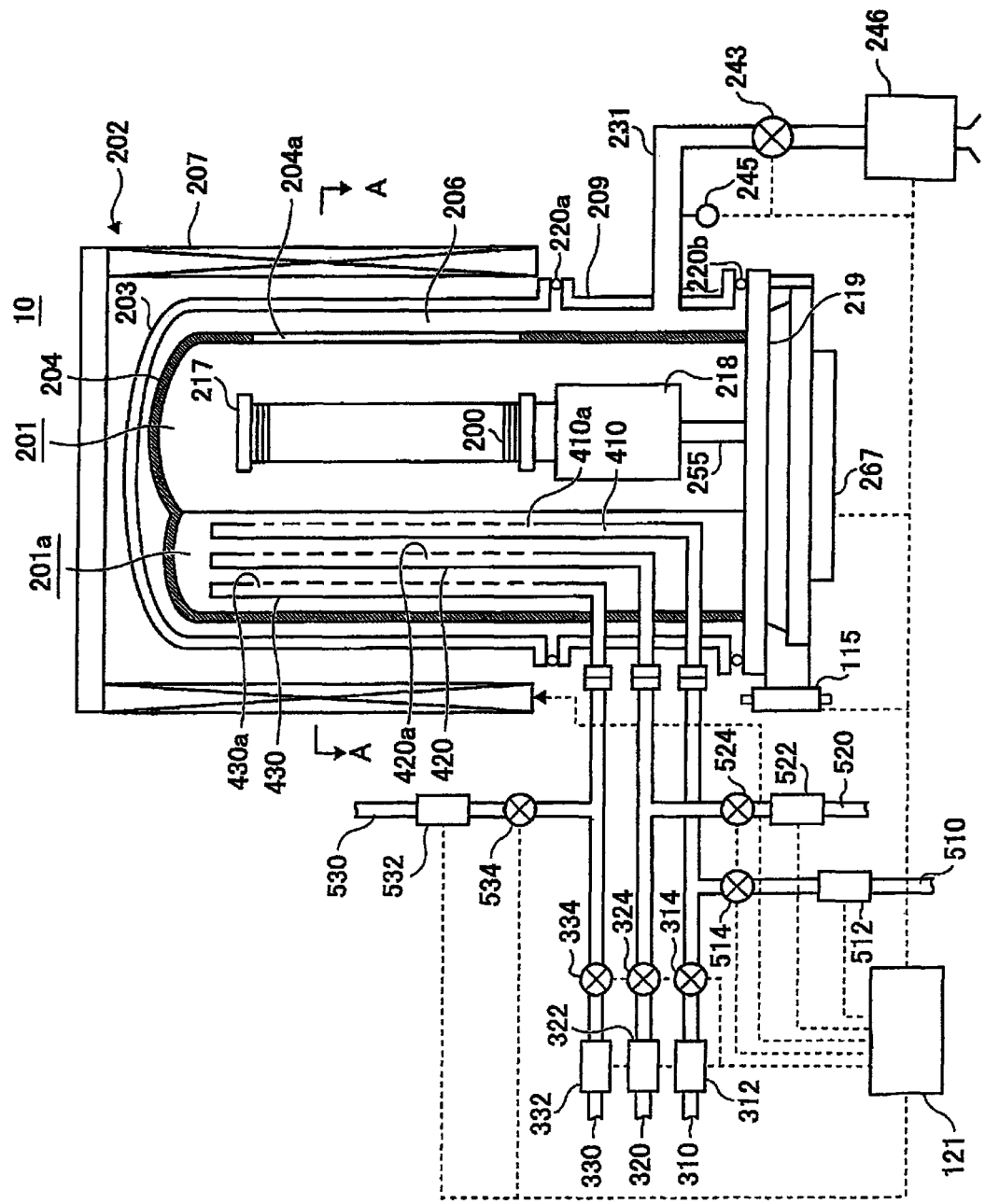
FIG. 1 is a diagram schematically illustrating a vertical cross-section of a vertical type process furnace of a substrate processing apparatus according to one or more embodiments described herein.

Hereinafter, one or more embodiments (also simply referred to as "embodiments") according to the technique of the present disclosure will be described with reference to FIGS. 1 through 5. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

A substrate processing apparatus 10 according to the present embodiments includes a process furnace 202 provided with a heater 207 serving as a heating structure (which is a heating device or a heating system). The heater 207 is of a cylindrical shape, and is vertically installed while being supported by a heater base (not shown) serving as a support plate.

An outer tube 203 constituting a reaction tube (which is a part of a reaction vessel or a process vessel) is provided in an inner side of the heater 207 to be aligned in a manner concentric with the heater 207. For example, the outer tube 203 is made of a heat resistant material such as quartz ($SiO_2$) and silicon carbide (SiC). The outer tube 203 is of a cylindrical shape with a closed upper end and an open lower end. A manifold (which is an inlet flange) 209 is provided under the outer tube 203 to be aligned in a manner concentric with the outer tube 203. The manifold 209 is made of a metal such as stainless steel (SUS). The manifold 209 is of a cylindrical shape with open upper and lower ends. An O-ring 220a serving as a seal is provided between the upper end of the manifold 209 and the outer tube 203. As the manifold 209 is supported by the heater base (not shown), the outer tube 203 is installed vertically.

An inner tube 204 constituting the reaction tube (that is, a part of the reaction vessel or the process vessel) is provided in an inner side of the outer tube 203. For example, the inner tube 204 is made of a heat resistant material such as quartz ($SiO_2$) and silicon carbide (SiC). The inner tube 204 is of a cylindrical shape with a closed upper end and an open lower end. The process vessel (reaction vessel) is constituted mainly by the outer tube 203, the inner tube 204 and the manifold 209. A process chamber 201 is provided in a hollow cylindrical portion of the process vessel (that is, an inside of the inner tube 204).

The process chamber 201 is configured to accommodate a plurality of wafers including a wafer 200 serving as a substrate vertically in a horizontal orientation in a multistage manner by a boat 217 described later. Hereinafter, the plurality of wafers including the wafer 200 may also be simply referred to as wafers 200.

Nozzles 410, 420 and 430 are installed in the process chamber 201 so as to penetrate a side wall of the manifold 209 and the inner tube 204. Gas supply pipe 310, 320 and 330 are connected to the nozzles 410, 420 and 430, respectively. However, the process furnace 202 of the present embodiments is not limited to the example described above.

Mass flow controllers (MFCs) 312, 322 and 332 serving as flow rate controllers (flow rate control structures) and valves 314, 324 and 334 serving as opening/closing valves are sequentially installed at the gas supply pipes 310, 320 and 330 in order from upstream sides to downstream sides of the gas supply pipes 310, 320 and 330, respectively. Gas supply pipes 510, 520 and 530 configured to supply an inert gas are connected to the gas supply pipes 310, 320 and 330 at downstream sides of the valves 314, 324 and 334, respectively. MFCs 512, 522 and 532 serving as flow rate controllers (flow rate control structures) and valves 514, 524 and 534 serving as opening/closing valves are sequentially installed at the gas supply pipes 510, 520 and 530 in order from upstream sides to downstream sides of the gas supply pipes 510, 520 and 530, respectively.

The nozzles 410, 420 and 430 are connected to front ends (tips) of the gas supply pipes 310, 320 and 330, respectively. Each of the nozzles 410, 420 and 430 may include an L-shaped nozzle. Horizontal portions of the nozzles 410, 420 and 430 are installed so as to penetrate the side wall of the manifold 209 and the inner tube 204. Vertical portions of the nozzles 410, 420 and 430 are installed in a spare chamber 201a of a channel shape (a groove shape) protruding outward in a radial direction of the inner tube 204 and extending in the vertical direction. That is, the vertical portions of the nozzles 410, 420 and 430 are installed in the spare chamber 201a toward the upper end of the inner tube 204 (in a direction in which the wafers 200 are arranged) and along an inner wall of the inner tube 204.

The nozzles 410, 420 and 430 extend from a lower region of the process chamber 201 to an upper region of the process chamber 201. The nozzles 410, 420 and 430 are provided with a plurality of gas supply holes 410a, a plurality of gas supply holes 420a and a plurality of gas supply holes 430a facing the wafers 200, respectively. Thereby, a gas such as a process gas can be supplied to the wafers 200 through the plurality of gas supply holes 410a of the nozzle 410, the plurality of gas supply holes 420a of the nozzle 420 and the plurality of gas supply holes 430a of the nozzle 430. The plurality of gas supply holes 410a, the plurality of gas supply holes 420a and the plurality of gas supply holes 430a are provided from a lower portion to an upper portion of the inner tube 204. An opening area of each of the gas supply holes 410a, the gas supply holes 420a and the gas supply holes 430a is the same, and each of the gas supply holes 410a, the gas supply holes 420a and the gas supply holes 430a is provided at the same pitch. However, the plurality of gas supply holes 410a, the plurality of gas supply holes 420a and the plurality of gas supply holes 430a are not limited thereto. For example, the opening area of each of the gas supply holes 410a, the gas supply holes 420a and the gas supply holes 430a may gradually increase from the lower portion to the upper portion of the inner tube 204 to further uniformize a flow rate of the gas supplied through the plurality of gas supply holes 410a, the plurality of gas supply holes 420a and the plurality of gas supply holes 430a.

The plurality of gas supply holes 410a of the nozzle 410, the plurality of gas supply holes 420a of the nozzle 420 and the plurality of gas supply holes 430a of the nozzle 430 are provided from a lower portion to an upper portion of the boat 217 described later. Therefore, the process gas supplied into the process chamber 201 through the plurality of gas supply holes 410a, the plurality of gas supply holes 420a and the plurality of gas supply holes 430a is supplied onto the wafers 200 accommodated in the boat 217 from the lower portion to the upper portion thereof, that is, the entirety of the wafers 200 accommodated in the boat 217. It is preferable that the nozzles 410, 420 and 430 extend from the lower region to the upper region of the process chamber 201. However, the nozzles 410, 420 and 430 may extend only to the vicinity of a ceiling of the boat 217.

A source gas containing a first element (also referred to as a "first element-containing gas") is supplied into the process chamber 201 through the gas supply pipe 310 provided with the MFC 312 and the valve 314 and the nozzle 410. The source gas serves as one of process gases.

A third reducing gas serving as one of the process gases is supplied into the process chamber 201 through the gas supply pipe 320 provided with the MFC 322 and the valve 324 and the nozzle 420.

A reducing gas (for example, a gas such as a first reducing gas and a second reducing gas) serving as one of the process gases is supplied into the process chamber 201 through the gas supply pipe 330 provided with the MFC 332 and the valve 334 and the nozzle 430.

The inert gas such as a nitrogen ($N_2$) gas is supplied into the process chamber 201 through the gas supply pipes 510, 520 and 530 provided with the MFCs 512, 522 and 532 and the valves 514, 524 and 534, respectively, and the nozzles 410, 420 and 430. While the present embodiments will be described by way of an example in which the $N_2$ gas is used as the inert gas, the inert gas according to the present embodiments is not limited thereto. For example, instead of the $N_2$ gas, a rare gas such as argon (Ar) gas, helium (He) gas, neon (Ne) gas and xenon (Xe) gas may be used as the inert gas.

A process gas supplier (which is a process gas supply system) is constituted mainly by the gas supply pipes 310, 320 and 330, the MFCs 312, 322 and 332, the valves 314, 324 and 334 and the nozzles 410, 420, 430. However, the nozzles 410, 420 and 430 may be considered as the process gas supplier. The process gas supplier may also be simply referred to as a "gas supplier" (which is a gas supply system). When the source gas is supplied through the gas supply pipe 310, a source gas supplier (which is a source gas supply system) is constituted mainly by the gas supply pipe 310, the MFC 312 and the valve 314. The source gas supplier may further include the nozzle 410. When a silicon (Si)-containing gas is supplied through the gas supply pipe 320, a silicon-containing gas supplier (which is a silicon-containing gas supply system) is constituted mainly by the gas supply pipe 320, the MFC 322 and the valve 324. The silicon-containing gas supplier may further include the nozzle 420. When the reducing gas is supplied through the gas supply pipe 330, a reducing gas supplier (which is a reducing gas supply system) is constituted mainly by the gas supply pipe 330, the MFC 332 and the valve 334. The reducing gas supplier may further include the nozzle 430. When a nitrogen (N)-containing gas serving as the reducing gas is supplied through the gas supply pipe 330, the reducing gas supplier may also be referred to as a "nitrogen-containing gas supplier" (which is a nitrogen-containing gas supply system). An inert gas supplier (which is an inert gas supply system) is constituted mainly by the gas supply pipes 510, 520 and 530, the MFCs 512, 522 and 532 and the valves 514, 524 and 534.

According to the present embodiments, the gas is supplied into a vertically long annular space which is defined by the inner wall of the inner tube 204 and edges (peripheries) of the wafers 200 through the nozzles 410, 420 and 430 provided in the spare chamber 201a. The gas is ejected into the inner tube 204 through the plurality of gas supply holes 410a of the nozzle 410, the plurality of gas supply holes 420a of the nozzle 420 and the plurality of gas supply holes 430a of the nozzle 430 facing the wafers 200. Specifically, gases such as the process gases are ejected into the inner tube 204 in a direction parallel to surfaces of the wafers 200 through the plurality of gas supply holes 410a of the nozzle 410, the plurality of gas supply holes 420a of the nozzle 420 and the plurality of gas supply holes 430a of the nozzle 430.

An exhaust hole (exhaust port) 204a is a through-hole facing the nozzles 410, 420 and 430, and is provided at a side wall of the inner tube 204. For example, the exhaust hole 204a may be of a narrow slit-shaped through-hole elongating vertically. The gas supplied into the process chamber 201 through the plurality of gas supply holes 410a of the nozzle 410, the plurality of gas supply holes 420a of the nozzle 420 and the plurality of gas supply holes 430a of the nozzle 430 flows over the surfaces of the wafers 200. The gas that has flowed over the surfaces of the wafers 200 is exhausted through the exhaust hole 204a into a gap (that is, an exhaust path 206) provided between the inner tube 204 and the outer tube 203. The gas flowing in the exhaust path 206 flows into an exhaust pipe 231 and is then discharged (exhausted) out of the process furnace 202.

The exhaust hole 204a is provided to face the wafers 200. The gas supplied in the vicinity of the wafers 200 in the process chamber 201 through the plurality of gas supply holes 410a, the plurality of gas supply holes 420a and the plurality of gas supply holes 430a flows in the horizontal direction. The gas that has flowed in the horizontal direction is exhausted through the exhaust hole 204a into the exhaust path 206. The exhaust hole 204a is not limited to the slit-shaped through-hole. For example, the exhaust hole 204a may be configured as a plurality of holes.

The exhaust pipe 231 through which an inner atmosphere of the process chamber 201 is exhausted is installed at the manifold 209. A pressure sensor 245 serving as a pressure detector (pressure detecting structure) configured to detect an inner pressure of the process chamber 201, an APC (Automatic Pressure Controller) valve 243 and a vacuum pump 246 serving as a vacuum exhaust apparatus are sequentially installed at the exhaust pipe 231 in order from an upstream side to a downstream side of the exhaust pipe 231. With the vacuum pump 246 in operation, the APC valve 243 may be opened or closed to perform a vacuum exhaust of the process chamber 201 or stop the vacuum exhaust. With the vacuum pump 246 in operation, an opening degree of the APC valve 243 may be adjusted in order to adjust the inner pressure of the process chamber 201. An exhauster (which is an exhaust system) is constituted mainly by the exhaust hole 204a, the exhaust path 206, the exhaust pipe 231, the APC valve 243 and the pressure sensor 245. The exhauster may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from thereunder. The seal cap 219 is made of a metal such as SUS, and is of a disk shape. An O-ring 220b serving as a seal is provided on an upper surface of the seal cap 219 so as to be in contact with the lower end of the manifold 209. A rotator 267 configured to rotate the boat 217 accommodating the wafers 200 is provided at the seal cap 219 opposite to the process chamber 201. A rotating shaft 255 of the rotator 267 is connected to the boat 217 through the seal cap 219. As the rotator 267 rotates the boat 217, the wafers 200 are rotated. The seal cap 219 may be elevated or lowered in the vertical direction by a boat elevator 115 serving as an elevator vertically provided outside the outer tube 203. When the seal cap 219 is elevated or lowered in the vertical direction by the boat elevator 115, the boat 217 may be transferred (loaded) into the process chamber 201 or transferred (unloaded) out of the process chamber 201. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201.

The boat 217 serving as a substrate retainer is configured to accommodate (support) the wafers 200 (for example, 25 to 200 wafers) while the wafers 200 are horizontally oriented with their centers aligned with each other with a predetermined interval therebetween in a multistage manner. For example, the boat 217 is made of a heat resistant material such as quartz and SiC. An insulating plate 218 horizontally oriented is provided under the boat 217 in a multistage manner (not shown). The insulating plate 218 is made of a heat resistant material such as quartz and SiC. With such a configuration, the insulating plate 218 suppresses the transmission of the heat from the heater 207 to the seal cap 219. However, the present embodiments are not limited thereto. For example, instead of the insulating plate 218, a heat insulating cylinder (not shown) such as a cylinder made of a heat resistant material such as quartz and SiC may be provided under the boat 217.

Figure 2:
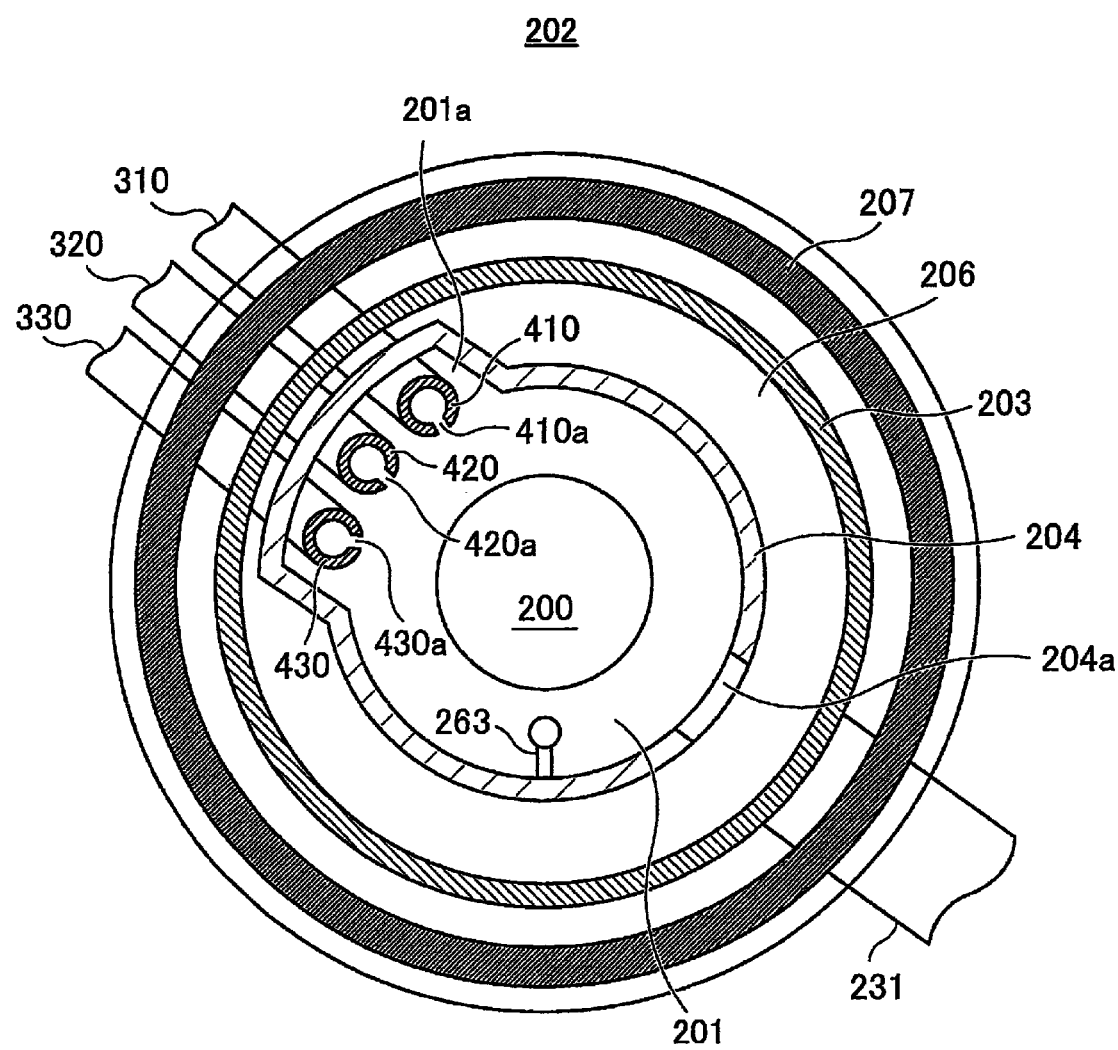
FIG. 2 is a diagram schematically illustrating a horizontal cross-section taken along the line A-A of the vertical type process furnace of the substrate processing apparatus according to the embodiments shown in FIG. 1.

As shown in FIG. 2, a temperature sensor 263 serving as a temperature detector is installed in the inner tube 204. An amount of the current supplied to the heater 207 is adjusted based on temperature information detected by the temperature sensor 263 such that a desired temperature distribution of an inner temperature of the process chamber 201 can be obtained. Similar to the nozzles 410, 420 and 430, the temperature sensor 263 is L-shaped, and is provided along the inner wall of the inner tube 204.

Figure 3:
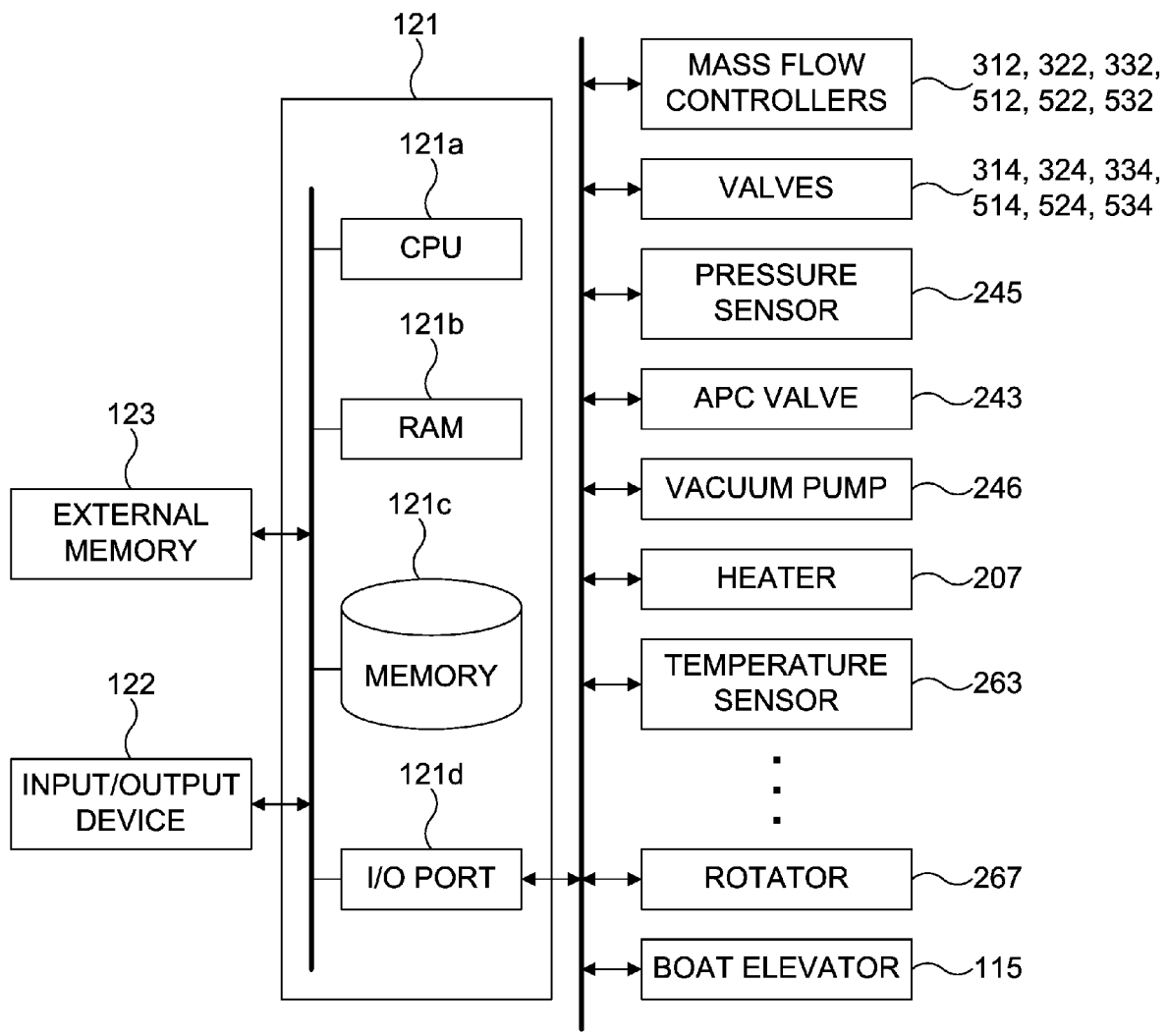
FIG. 3 is a block diagram schematically illustrating a configuration of a controller and related components of the substrate processing apparatus according to the embodiments described herein.

As shown in FIG. 3, a controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus. For example, an input/output device 122 such as a touch panel is connected to the controller 121.

The memory 121c is configured by a component such as a flash memory and a hard disk drive (HDD). For example, a control program configured to control the operation of the substrate processing apparatus 10 or a process recipe containing information on the sequences and conditions of a method of manufacturing a semiconductor device described later is readably stored in the memory 121c. The process recipe is obtained by combining steps of the method of manufacturing the semiconductor device described later such that the controller 121 can execute the steps to acquire a predetermine result, and functions as a program. Hereafter, the process recipe and the control program may be collectively or individually referred to as a "program". In the present specification, the term "program" may refer to the process recipe alone, may refer to the control program alone, or may refer to a combination of the process recipe and the control program. The RAM 121b functions as a memory area (work area) where a program or data read by the CPU 121a is temporarily stored.

The I/O port 121d is connected to the above-described components such as the MFCs 312, 322, 332, 512, 522 and 532, the valves 314, 324, 334, 514, 524 and 534, the pressure sensor 245, the APC valve 243, the vacuum pump 246, the heater 207, the temperature sensor 263, the rotator 267 and the boat elevator 115.

The CPU 121a is configured to read the control program from the memory 121c and execute the read control program. In addition, the CPU 121a is configured to read a recipe such as the process recipe from the memory 121c in accordance with an operation command inputted from the input/output device 122. According to the contents of the read recipe, the CPU 121a may be configured to control various operations such as flow rate adjusting operations for various gases by the MFCs 312, 322, 332, 512, 522 and 532, opening and closing operations of the valves 314, 324, 334, 514, 524 and 534, an opening and closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting the rotation and the rotation speed of the boat 217 by the rotator 267, an elevating and lowering operation of the boat 217 by the boat elevator 115 and an operation of transferring and accommodating the wafer 200 into the boat 217.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The memory 121c or the external memory 123 may be embodied by a non-transitory computer readable recording medium. Hereafter, the memory 121c and the external memory 123 are collectively or individually referred to as a recording medium. In the present specification, the term "recording medium" may refer to the memory 121c alone, may refer to the external memory 123 alone, and may refer to both of the memory 121c and the external memory 123. Instead of the external memory 123, a communication means such as the Internet and a dedicated line may be used for providing the program to the computer.

(2) Substrate Processing

Figure 4:
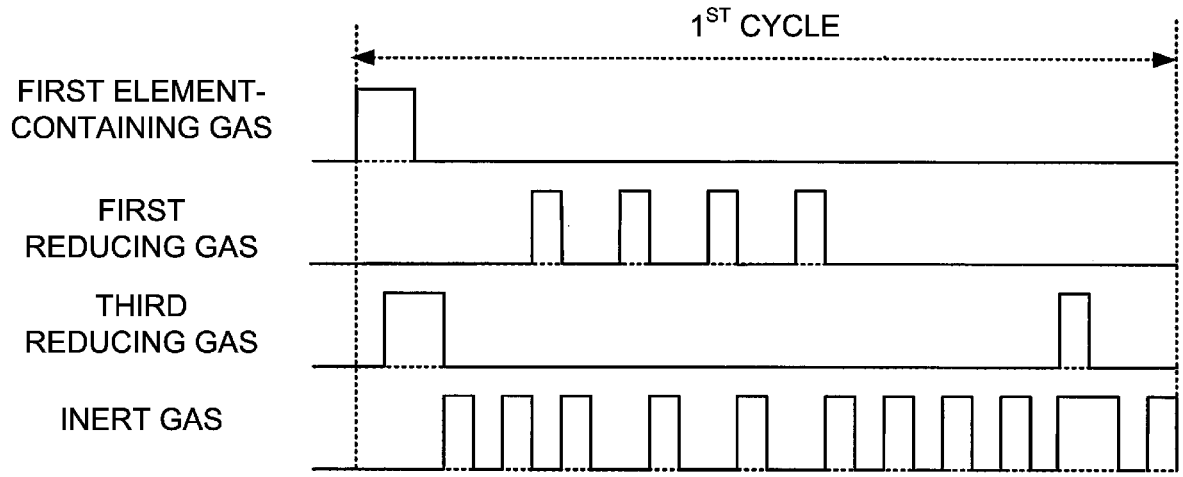
FIG. 4 is a diagram schematically illustrating a seed layer forming step of a substrate processing according to the embodiments described herein.
Figure 5:
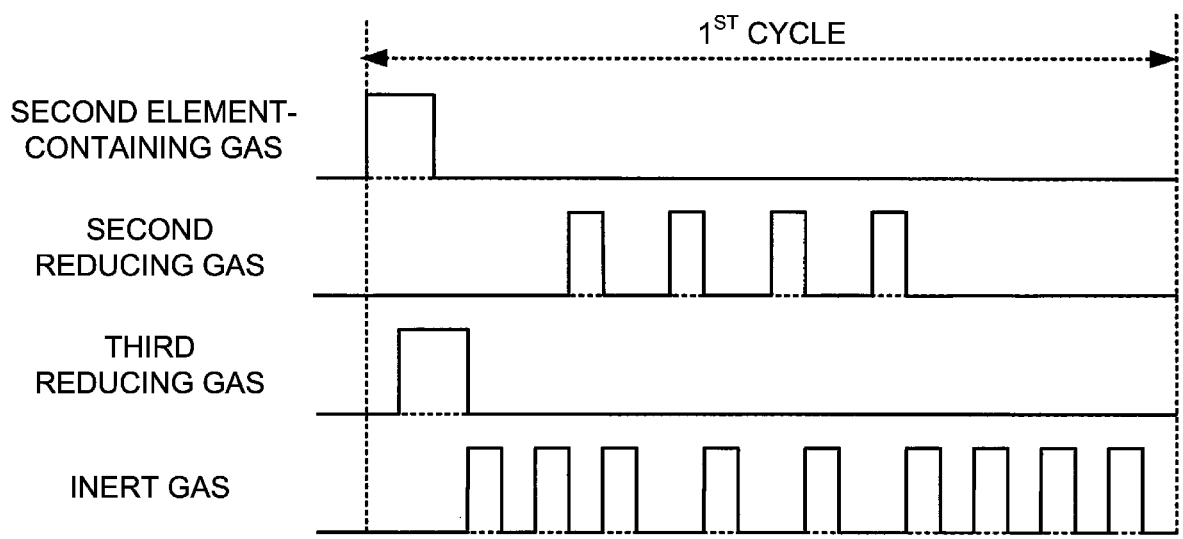
FIG. 5 is a diagram schematically illustrating a titanium nitride layer (TiN) forming step of the substrate processing according to the embodiments described herein.

Hereinafter, as a part of manufacturing processes of a semiconductor device, an exemplary substrate processing of forming a titanium nitride film (TiN film) on the wafer 200 will be described with reference to FIGS. 4 and 5. The substrate processing of forming the TiN film is performed using the process furnace 202 of the substrate processing apparatus 10 described above. In the following description, the operations of the components constituting the substrate processing apparatus 10 are controlled by the controller 121.

The substrate processing (that is, the manufacturing processes of the semiconductor device) according to the present embodiments may include: transferring the wafer 200 into the process chamber 201; (a) forming a first layer serving as a seed layer on the wafer 200 by performing a first layer forming cycle once or more, wherein the first layer forming cycle includes: (a1) supplying a metal containing gas as a first element-containing gas to the wafer 200 in the process chamber 201; and (a2) supplying a first reducing gas to the wafer 200 a plurality of times, and wherein (a1) and (a2) are sequentially performed in the first layer forming cycle; and (b) forming a second layer on the first layer by performing a second layer forming cycle once or more after (a), wherein the second layer forming cycle includes: (b1) supplying a metal containing gas as a second element-containing gas to the wafer 200; and (b2) supplying a second reducing gas to the wafer 200, and wherein (b1) and (b2) are sequentially performed in the second layer forming cycle.

The first layer forming cycle may include (a3) supplying a third reducing gas to the wafer 200, wherein (a3) is started while (a1) is performed.

The first layer forming cycle may include (a3) supplying a third reducing gas to the wafer 200, wherein (a3) continues to be performed after (a1) is completed.

In the present specification, the term "wafer" may refer to "a wafer itself", may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", may refer to "a surface of a predetermined layer or a film formed on a wafer". In the present specification, the term "substrate" and "wafer" may be used as substantially the same meaning. That is, the term "substrate" may be substituted by "wafer" and vice versa.

<Wafer Charging Step and Boat Loading Step>

The wafers 200 are charged (transferred) into the boat 217 (wafer charging step). After the boat 217 is charged with the wafers 200, as shown in FIG. 1, the boat 217 charged with the wafers 200 is elevated by the boat elevator 115 and loaded (transferred) into the process chamber 201 (boat loading step). With the boat 217 loaded, the seal cap 219 seals a lower end opening of the reaction tube via the O-ring 220b.

<Pressure Adjusting Step and Temperature Adjusting Step>

The vacuum pump 246 vacuum-exhausts the inner atmosphere of the process chamber 201 until the inner pressure of the process chamber 201 (that is, a space in which the wafers 200 are accommodated) reaches and is maintained at a desired pressure (vacuum degree). The inner pressure of the process chamber 201 is measured by the pressure sensor 245, and the APC valve 243 is feedback-controlled based on measured pressure information (pressure adjusting step). The vacuum pump 246 continuously vacuum-exhausts the inner atmosphere of the process chamber 201 until at least the processing of the wafer 200 is completed. The heater 207 heats the process chamber 201 until the inner temperature of the process chamber 201 reaches and is maintained at a desired temperature. The amount of the current supplied to the heater 207 is feedback-controlled based on the temperature information detected by the temperature sensor 263 such that the desired temperature distribution of the inner temperature of the process chamber 201 is obtained (temperature adjusting step). The heater 207 continuously heats the process chamber 201 until at least the processing of the wafer 200 is completed.

<First Layer (Seed Layer) Forming Step>

In the first layer forming step, by performing a first layer forming cycle including a first step through an eighth step a predetermined number of times, a first layer serving as a seed layer is formed on the wafer 200.

<First Element-Containing Gas Supply Step (First Step)>

The valve 314 is opened to supply the first element-containing gas into the gas supply pipe 310. A flow rate of the first element-containing gas supplied into the gas supply pipe 310 is adjusted by the MFC 312. The first element-containing gas whose flow rate is adjusted is then supplied into the process chamber 201 through the plurality of gas supply holes 410a of the nozzle 410, and is exhausted through the exhaust pipe 231. Thereby, the first element-containing gas is supplied to the wafers 200. In the first step, in parallel with the supply of the first element-containing gas, the valve 514 may be opened to supply the inert gas such as the $N_2$ gas into the gas supply pipe 510. In the first step, in order to prevent the first element-containing gas from entering the nozzles 420 and 430, the valves 524 and 534 may be opened to supply the inert gas into the gas supply pipes 520 and 530.

In the first step, for example, the APC valve 243 is appropriately adjusted (controlled) to adjust the inner pressure of the process chamber 201 to a pressure ranging from 1 Pa to 3,990 Pa. For example, a supply flow rate of the first element-containing gas controlled by the MFC 312 may be set to a flow rate ranging from 0.1 slm to 2.0 slm. Hereinafter, a temperature of the heater 207 is set such that a temperature of the wafer 200 reaches and is maintained at a temperature ranging from 300° C. to 550° C. In the present specification, a notation of a numerical range such as "from 1 Pa to 3,990 Pa" means that a lower limit and an upper limit are included in the numerical range. Therefore, for example, a numerical range "from 1 Pa to 3,990 Pa" means a range equal to or higher than 1 Pa and equal to or lower than 3,990 Pa. The same also applies to other numerical ranges described herein.

In the first step, the first element-containing gas alone is supplied to the wafer 200. According to the present embodiments, for example, a halogen-based source (which is a halide or a halogen-based titanium source) gas containing titanium (Ti) as the first element and halogen may be used as the first element-containing gas. For example, titanium tetrachloride ($TiCl_4$) gas may be used as the halogen-based source gas. By supplying the first element-containing gas, a first element-containing layer is formed on the wafer 200 (that is, on a base film on the surface of the wafer 200). When the $TiCl_4$ gas is used as the first element-containing gas in the first step, a titanium-containing layer (that is, a layer containing titanium (Ti)) is formed as the first element-containing layer. The titanium-containing layer may refer to a titanium layer containing chlorine (Cl), may refer to an adsorption layer of the $TiCl_4$ gas, or may refer to both of the titanium layer containing chlorine and the adsorption layer of the $TiCl_4$ gas.

<Step of Simultaneously Supplying First Element-Containing Gas and Third Reducing Gas (Second Step)>

After a predetermined time (for example, from 0.01 second to 5 seconds) has elapsed from the supply of the first element-containing gas, the valve 324 is opened to supply the third reducing gas into the gas supply pipe 320. A flow rate of the third reducing gas supplied into the gas supply pipe 320 is adjusted by the MFC 322. The third reducing gas whose flow rate is adjusted is then supplied into the process chamber 201 through the plurality of gas supply holes 420a of the nozzle 420, and is exhausted through the exhaust pipe 231. In the second step, in parallel with the supply of the third reducing gas, the valve 524 may be opened to supply the inert gas such as the $N_2$ gas into the gas supply pipe 520. In the second step, in order to prevent the first element-containing gas and the third reducing gas from entering the nozzle 430, the valve 534 may be opened to supply the inert gas such into the gas supply pipe 530. In the second step, thereby, the first element-containing gas and the third reducing gas are simultaneously supplied to the wafers 200. That is, in the first layer forming step, there is a timing at which at least the first element-containing gas and the third reducing gas are simultaneously supplied. In other words, the first layer forming step includes a step (that is, the second step) of supplying the third reducing gas to the wafer 200 while the first element-containing gas is supplied to the wafer 200. By supplying the third reducing gas together with the first element-containing gas in the second step, it is possible to remove reaction by-products generated while the first element-containing gas is supplied in the first step during a second or later performance of the first layer forming cycle. As a result, it is possible to increase adsorption sites of the first element. For example, the silicon-containing gas may be used as the third reducing gas. For example, a silane-based gas or a chlorosilane-based gas may be used as the silicon-containing gas. For example, silane ($SiH_4$) gas may be used as the silane-based gas. For example, hexachlorodisilane ($Si_2Cl_6$) gas may be used as the chlorosilane-based gas. The numbers of silicon, hydrogen (H) and chlorine (Cl) in the silane-based gas may be different from those of the chlorosilane-based gas. For example, a gas such as disilane ($Si_2H_6$) gas, trisilane ($Si_3H_8$) gas, tetrasilane ($Si_4H_{10}$) gas may be used as the silane-based gas. For example, a gas such as monochlorosilane ($SiH_3Cl$) gas, dichlorosilane ($SiH_2Cl_2$) gas, trichlorosilane ($SiHCl_3$) gas may be used as the chlorosilane-based gas.

In the second step, for example, the APC valve 243 is appropriately adjusted (controlled) to adjust the inner pressure of the process chamber 201 to a pressure ranging from 130 Pa to 3,990 Pa. For example, a supply flow rate of the third reducing gas controlled by the MFC 322 may be set to a flow rate ranging from 0.1 slm to 5.0 slm.

<Third Reducing Gas Supply Step (Third Step)>

After a predetermined time (for example, from 0.01 second to 10 seconds) has elapsed from the supply of the first element-containing gas, the valve 314 of the gas supply pipe 310 is closed to stop the supply of the first element-containing gas. In the third step, in order to prevent the third reducing gas from entering the nozzles 410 and 430, the valves 514 and 534 may be opened to supply the inert gas into the gas supply pipes 510 and 530. In the third step, the third reducing gas alone is supplied to the wafer 200. By supplying the third reducing gas alone in the third step, it is possible to remove the reaction by-products generated while the first element-containing gas is supplied in the first step during the second or later performance of the first layer forming cycle. As a result, it is possible to increase the adsorption sites of the first element.

<Purge Step (Fourth Step)>

Subsequently, as the purge step (fourth step), an inert gas supply step (first sub-step of the fourth step), an exhaust step (second sub-step of the fourth step) and an inert gas supply step (third sub-step of the fourth step) are sequentially performed in order.

<Inert Gas Supply Step (First Sub-Step of Fourth Step)>

After a predetermined time (for example, from 0.01 second to 60 seconds) has elapsed from the supply of the third reducing gas, the valve 324 is closed to stop the supply of the third reducing gas. In the first sub-step of the fourth step, the valves 514, 524 and 534 are opened to supply the inert gas into the process chamber 201. In the first sub-step of the fourth step, with adjusting the opening degree of the APC valve 243 of the exhaust pipe 231 to an opening degree ranging from about 50% to a fully open state (that is, 100%), the vacuum pump 246 vacuum-exhausts the inner atmosphere of the process chamber 201 to remove a residual gas in the process chamber 201 such as the first element-containing gas and the third reducing gas which did not react or which contributed to the formation of the first element-containing layer from the process chamber 201. In the first sub-step of the fourth step, the inert gas serves as a purge gas. When the $TiCl_4$ gas is used as the first element-containing gas and the $SiH_4$ gas is used as the third reducing gas, HCl serving as a growth inhibitor reacts with the $SiH_4$ to generate silicon tetrachloride ($SiCl_4$) and $H_2$ in the process chamber 201, and the generated $SiCl_4$ and $H_2$ are exhausted from the process chamber 201 in the first sub-step of the fourth step. For example, supply flow rates of the inert gas controlled by the MFCs 512, 522 and 532 may be set to be within a range from 1 slm to 10 slm. For example, a supply time (time duration) of supplying the inert gas to the wafer 200 may be set to a time ranging from 0.1 second to 10 seconds.

<Exhaust Step (Second Sub-Step of Fourth step)>

After a predetermined time (for example, from 0.1 second to 10 seconds) has elapsed from the supply of the inert gas in the first sub-step of the fourth step, the valves 514, 524 and 534 are closed to stop the supply of the inert gas. In the second sub-step of the fourth step, with adjusting the opening degree of the APC valve 243 of the exhaust pipe 231 to the opening degree ranging from about 50% to the fully open state (that is, 100%), the vacuum pump 246 vacuum-exhausts the inner atmosphere of the process chamber 201. Thereby, it is possible to improve the efficiency of removing the residual gas in the process chamber 201 such as the first element-containing gas and the third reducing gas which did not react or which contributed to the formation of the first element-containing layer from the process chamber 201. For example, a time duration while the supply of the inert gas is stopped and the inner atmosphere of the process chamber 201 is exhausted in the second sub-step of the fourth step may be set to 2 seconds.

<Inert Gas Supply Step (Third Sub-Step of Fourth Step)>

After a predetermined time (for example, 2 seconds) has elapsed from the vacuum-exhaust in the second sub-step of the fourth step, the valves 514, 524 and 534 are opened to supply the inert gas into the process chamber 201. In the third sub-step of the fourth step, with adjusting the opening degree of the APC valve 243 of the exhaust pipe 231 to the opening degree ranging from about 50% to the fully open state (that is, 100%), the vacuum pump 246 vacuum-exhausts the inner atmosphere of the process chamber 201 to replace the inner atmosphere of the process chamber 201 with an inert gas atmosphere. In the third sub-step of the fourth step, the inert gas serves as the purge gas. For example, each supply flow rate of the inert gas controlled by the MFCs 512, 522 and 532 may be set to 3.6 slm. For example, a supply time (time duration) of supplying the inert gas to the wafer 200 in the third sub-step of the fourth step may be set to 2 seconds.

<First Reducing Gas Supply and Purge Step (Fifth Step)>

Subsequently, as the first reducing gas supply and purge step (fifth step), a cycle in which a first reducing gas supply step (first sub-step of the fifth step) and a purge step (second sub-step of the fifth step) are sequentially performed is performed a predetermined number of times (for example, 4 times). That is, in the fifth step, the first reducing gas is supplied to the wafer 200 a plurality of times.

<First Reducing Gas Supply Step (First Sub-Step of Fifth Step)>

After a predetermined time (for example, from 0.1 second to 10 seconds) has elapsed from the supply of the inert gas in the third sub-step of the fourth step, the valves 514, 524 and 534 are closed to stop the supply of the inert gas into the process chamber 201. In the first sub-step of the fifth step, the valve 334 is opened to supply the first reducing gas into the gas supply pipe 330. A flow rate of the first reducing gas supplied into the gas supply pipe 330 is adjusted by the MFC 332. The first reducing gas whose flow rate is adjusted is then supplied into the process chamber 201 through the plurality of gas supply holes 430a of the nozzle 430, and is exhausted through the exhaust pipe 231. Thereby, the first reducing gas is supplied to the wafers 200. In the first sub-step of the fifth step, in parallel with the supply of the first reducing gas, the valve 534 may be opened to supply the inert gas into the gas supply pipe 530. In the first sub-step of the fifth step, in order to prevent the first reducing gas from entering the nozzles 410 and 420, the valves 514 and 524 may be opened to supply the inert gas into the gas supply pipes 510 and 520.

In the first sub-step of the fifth step, for example, the APC valve 243 is appropriately adjusted (controlled) to adjust the inner pressure of the process chamber 201 to a pressure ranging from 1 Pa to 3,990 Pa. For example, a supply flow rate of the first reducing gas controlled by the MFC 332 in the first sub-step of the fifth step may be set to a flow rate ranging from 0.1 slm to 30.0 slm. For example, a supply time (time duration) of supplying the first reducing gas to the wafer 200 may be set to a time ranging from 0.01 second to 30 seconds.

In the first sub-step of the fifth step, the first reducing gas alone is supplied to the wafer 200. According to the present embodiments, for example, a gas containing nitrogen (N) and hydrogen (H) such as ammonia ($NH_3$) gas, diazene ($N_2H_2$) gas, hydrazine ($N_2H_4$) gas and triazene ($N_3H_3$) gas may be used as the first reducing gas. When the $NH_3$ gas is used as the first reducing gas, a substitution reaction occurs between the $NH_3$ gas and at least a portion of the titanium-containing layer formed on the wafer 200. During the substitution reaction, titanium (Ti) contained in the titanium-containing layer and nitrogen (N) contained in the $NH_3$ gas are bonded to form a titanium nitride layer (TiN layer) on the wafer 200.

<Purge Step (Second Sub-Step of Fifth Step)>

After a predetermined time (for example, from 0.01 second to 60 seconds) has elapsed from the supply of the first reducing gas in the first sub-step of the fifth step, the valve 334 is closed to stop the supply of the first reducing gas. Subsequently, as the purge step (second sub-step of the fifth step), an inert gas supply step and an exhaust step are sequentially performed in order.

That is, the inert gas supply step of supplying the inert gas into the process chamber 201 by opening the valves 514, 524 and 534 and the exhaust step of exhausting the inner atmosphere of the process chamber 201 are sequentially performed in order. In the exhaust step of the second sub-step of the fifth step, with the APC valve 243 of the exhaust pipe 231 open, the vacuum pump 246 vacuum-exhausts the inner atmosphere of the process chamber 201 to remove a residual gas in the process chamber 201 such as unreacted portion of the first reducing gas or consumed portion of the first reducing gas which contributed to the formation of the first element-containing layer or the reaction by-products from the process chamber 201. In the second sub-step of the fifth step, the inert gas serves as the purge gas. By reducing the inner pressure of the process chamber 201 by continuously supplying the inert gas and exhausting the inner atmosphere of the process chamber 201, it is possible to improve a probability that the first reducing gas comes into contact with molecules of the unreacted portion of the first element-containing gas adsorbed on the wafer 200.

<Performing a Predetermined Number of Times>

By performing the cycle (in which the first sub-step of the fifth step and the second sub-step of the fifth step described above are sequentially performed in order) a predetermined number of times (for example, four times), the first element-containing layer is formed on the wafer 200. That is, the second sub-step of the fifth step is performed between each performance and its next performance of the first sub-step of the fifth step. In addition, the last performance (which is the fourth performance in the above example) of the second sub-step of the fifth step may be omitted because the first performance of the purge step (sixth step) described later overlaps with the last performance of the second sub-step of the fifth step.

<Purge Step (Sixth Step)>

Subsequently, as the purge step (sixth step), a cycle in which an inert gas supply step (first sub-step of the sixth step) and an exhaust step (second sub-step of the sixth step) are sequentially performed in order is performed a predetermined number of times (for example, four times).

<Inert Gas Supply Step (First Sub-Step of Sixth Step)>

The valves 514, 524 and 534 are opened to supply the inert gas into the process chamber 201. In the first sub-step of the sixth step, with the APC valve 243 of the exhaust pipe 231 open, the vacuum pump 246 vacuum-exhausts the inner atmosphere of the process chamber 201 to remove a residual gas in the process chamber 201 such as the unreacted portion of the first reducing gas or the consumed portion of the first reducing gas which contributed to the formation of the first element-containing layer from the process chamber 201. In the first sub-step of the sixth step, the inert gas serves as the purge gas. When the $NH_3$ gas is used as the first reducing gas, the HCl serving as a growth inhibitor reacts with the $NH_3$ to generate $NH_4Cl$ in the process chamber 201, and the generated $NH_4Cl$ is exhausted from the process chamber 201 in the first sub-step of the sixth step. For example, supply flow rates of the inert gas controlled by the MFCs 512, 522 and 532 may be set to be within a range from 0.1 slm to 50 slm. For example, a supply time (time duration) of supplying the inert gas to the wafer 200 in the first sub-step of the sixth step may be set to a time ranging from 1 second to 10 seconds.

<Exhaust Step (Second Sub-Step of Sixth Step)>

After a predetermined time (for example, 5 seconds) has elapsed from the supply of the inert gas in the first sub-step of the sixth step, the valves 514, 524 and 534 are closed to stop the supply of the inert gas. In the second sub-step of the sixth step, with the APC valve 243 of the exhaust pipe 231 open, the vacuum pump 246 vacuum-exhausts the inner atmosphere of the process chamber 201. For example, a time duration while the supply of the inert gas is stopped and the inner atmosphere of the process chamber 201 is exhausted in the second sub-step of the sixth step may be set to a time ranging from 1 second to 10 seconds.

<Performing a Predetermined Number of Times>

The cycle in which the first sub-step of the sixth step and the second sub-step of the sixth step described above are sequentially performed in order is performed a predetermined number of times (for example, four times). As a result, it is possible to reduce a concentration of the unreacted portion of the first reducing gas or the consumed portion of the first reducing gas which contributed to the formation of the first element-containing layer in the process chamber 201 before the first element-containing gas is supplied in the first step during the second or later performance of the first layer forming cycle. Thereby, it is possible to reduce an amount of the reaction by-products generated while the first element-containing gas is supplied. That is, an environment in the process chamber 201 can be initialized.

<Third Reducing Gas Supply Step (Seventh Step)>

Subsequently, the valve 324 is opened to supply the third reducing gas into the gas supply pipe 320. The flow rate of the third reducing gas supplied into the gas supply pipe 320 in the seventh step is adjusted by the MFC 322. The third reducing gas whose flow rate is adjusted is then supplied into the process chamber 201 through the plurality of gas supply holes 420a of the nozzle 420, and is exhausted through the exhaust pipe 231. In the seventh step, in parallel with the supply of the third reducing gas, the valve 524 is opened to supply the inert gas into the gas supply pipe 520.

In the seventh step, the opening degree of the APC valve 243 is adjusted to a substantially fully open state (that is, about 100%). For example, the supply flow rate of the third reducing gas controlled by the MFC 322 may be set to be within a range from 0.1 slm to 5 slm. In parallel therewith, the supply flow rate of the inert gas controlled by the MFC 522 may be set to be, for example, within a range from 0.1 slm to 5 slm. For example, the supply time (time duration) of supplying the third reducing gas to the wafer 200 may be set to a time ranging from 0.1 second to 20 seconds.

In the seventh step, the third reducing gas and the inert gas are supplied to the wafer 200. As a result, the first element-containing layer on the wafer 200 is modified into the first layer whose crystal grain (particle size) is small, whose density is high and which contains a third element contained in the third reducing gas. Thereby, the first layer is formed on the wafer 200. In the seventh step, when the first element-containing layer is the TiN layer and the $SiH_4$ gas is used as the third reducing gas, a titanium silicon nitride layer (TiSiN layer) serving as the first layer is formed on the surface of the wafer 200 (that is, on a surface of the TiN layer formed on the surface of the wafer 200).

<Purge Step (Eighth Step)>

Subsequently, as the purge step (eighth step), an inert gas supply step (first sub-step of the eighth step), an exhaust step (second sub-step of the eighth step) and an inert gas supply step (third sub-step of the eighth step) are sequentially performed in order.

<Inert Gas Supply Step (First Sub-Step of Eighth Step)>

After a predetermined time (for example, from 0.1 second to 20 seconds) has elapsed from the supply of the third reducing gas in the seventh step, the valve 324 is closed to stop the supply of the third reducing gas. In the first sub-step of the eighth step, the valves 514, 524 and 534 are opened to supply the inert gas into the process chamber 201. In the first sub-step of the eighth step, with adjusting the opening degree of the APC valve 243 of the exhaust pipe 231 to the substantially fully open state (that is, about 100%), the vacuum pump 246 vacuum-exhausts the inner atmosphere of the process chamber 201 to remove a residual gas in the process chamber 201 such as the third reducing gas which did not react or which contributed to the formation of the first layer and the reaction by-products from the process chamber 201. In the first sub-step of the eighth step, the inert gas serves as the purge gas. The growth inhibitor reacts with the third reducing gas, and is exhausted from the process chamber 201 in the first sub-step of the eighth step, When the $SiH_4$ gas is used as the third reducing gas, the growth inhibitor reacts with the $SiH_4$ to generate the silicon tetrachloride ($SiCl_4$) and the $H_2$ in the process chamber 201, and the generated $SiCl_4$ and $H_2$ are exhausted from the process chamber 201 in the first sub-step of the eighth step. For example, the supply flow rates of the inert gas controlled by the MFCs 512, 522 and 532 in the first sub-step of the eighth step may be set to be within a range from 1 slm to 50 slm. For example, the supply time (time duration) of supplying the inert gas to the wafer 200 in the first sub-step of the eighth step may be set to a time ranging from 0.1 second to 10 seconds.

<Exhaust Step (Second Sub-Step of Eighth Step)>

After a predetermined time (for example, from 0.1 second to 10 seconds) has elapsed from the supply of the inert gas in the first sub-step of the eighth step, the valves 514, 524 and 534 are closed to stop the supply of the inert gas. In the second sub-step of the eighth step, with adjusting the opening degree of the APC valve 243 of the exhaust pipe 231 to the opening degree ranging from about 50% to the fully open state (that is, 100%), the vacuum pump 246 vacuum-exhausts the inner atmosphere of the process chamber 201. For example, a time duration while the supply of the inert gas is stopped and the inner atmosphere of the process chamber 201 is exhausted in the second sub-step of the eighth step may be set to a time ranging from 0.1 second to 10 seconds. Thereby, it is possible to improve the efficiency of removing the residual gas in the process chamber 201 such as the third reducing gas which did not react or which contributed to the formation of the first layer from the process chamber 201.

<Inert Gas Supply Step (Third Sub-Step of Eighth Step)>

After a predetermined time (for example, 5 seconds) has elapsed from the exhaust in the second sub-step of the eighth step, the valves 514, 524 and 534 are opened to supply the inert gas into the process chamber 201. In the third sub-step of the eighth step, with adjusting the opening degree of the APC valve 243 of the exhaust pipe 231 to the substantially fully open state (that is, about 100%), the vacuum pump 246 vacuum-exhausts the inner atmosphere of the process chamber 201 to replace the inner atmosphere of the process chamber 201 with the inert gas atmosphere. In the third sub-step of the eighth step, the inert gas serves as the purge gas. For example, the supply flow rates of the inert gas controlled by the MFCs 512, 522 and 532 in the third sub-step of the eighth step may be set to be within a range from 1 slm to 50 slm. For example, the supply time (time duration) of supplying the inert gas to the wafer 200 in the third sub-step of the eighth step may be set to 5 seconds. As a result, it is possible to remove the reaction by-products from the process chamber 201, and also possible to replace the inner atmosphere of the process chamber 201 with the inert gas atmosphere. In addition, it is possible to promote the adsorption of the first element-containing gas during the next performance of the first layer forming cycle of the first layer forming step.

<Performing a Predetermined Number of Times>

By performing (repeatedly performing) the cycle (that is, the first layer forming cycle in which the first step through the eighth step described above are sequentially performed in order) a predetermined number of times (n times), the first layer serving as a seed layer of a predetermined thickness (for example, about 5 Å or more) is formed on the wafer 200. The first layer forming cycle (that is, the cycle including the first step though the eighth step) is effective when performed once or more. However, preferably, the first layer forming cycle is repeatedly performed until a thickness of the first layer is about 5 Å or more. More preferably, the first layer forming cycle is repeatedly performed until the thickness of the first layer is about 10 Å or more. While the first layer forming step is described in detail by way of an example in which the first layer contains the first element and the third element, the first layer may contain the first element without containing the third element. According to the present embodiments, when the $TiCl_4$ gas is used as the first element-containing gas, the $SiH_4$ gas is used as the third reducing gas and the $NH_3$ gas is used as the first reducing gas, the TiSiN layer is formed as the first layer.

<Second Layer Forming Step>

After the first layer serving as the seed layer is formed by the seed layer forming step (that is, the first layer forming step) described above, in the second layer forming step, a second layer forming cycle including a ninth step through a fourteenth step is repeatedly performed. The ninth step through the fourteenth step are similar to the first step through the sixth step of the seed layer forming step described above. Therefore, the ninth step through the fourteenth step will be briefly described.

<Second Element-Containing Gas Supply Step (Ninth Step)>

In the ninth step, the second element-containing gas is supplied into the process chamber 201 in the same manner as the supply of the first element-containing gas in the first step of the seed layer forming step described above. In the ninth step, the second element-containing gas alone is supplied into the process chamber 201. According to the present embodiments, for example, the halogen-based source gas (which is a halide or a halogen-based titanium source gas) containing titanium (Ti) as the second element and halogen may be used as the second element-containing gas. That is, the second element may be the same as the first element. For example, the titanium tetrachloride ($TiCl_4$) gas may be used as the halogen-based source gas. By supplying the $TiCl_4$ gas as the second element-containing gas, a second element-containing layer is formed on the wafer 200 on which the first layer is formed.

<Step of Simultaneously Supplying Second Element-Containing Gas and Third Reducing Gas (Tenth Step)>

In the tenth step, the third reducing gas is supplied into the process chamber 201 in the same manner as the simultaneous supply of the first element-containing gas and the third reducing gas in the second step of the seed layer forming step described above. In the tenth step, thereby, the second element-containing gas and the third reducing gas are simultaneously supplied to the wafer 200. That is, in the second layer forming step, there is a timing at which at least the second element-containing gas and the third reducing gas are simultaneously supplied. In other words, the second layer forming step includes a step (that is, the tenth step) of supplying the third reducing gas to the wafer 200 while the second element-containing gas is supplied to the wafer 200. By supplying the third reducing gas together with the second element-containing gas in the tenth step, it is possible to remove reaction by-products generated while the second element-containing gas is supplied in the ninth step during a second or later performance of the second layer forming cycle. As a result, it is possible to increase adsorption sites of an element such as the second element. Thereby, it is possible to improve a coverage rate.

In the tenth step, for example, the APC valve 243 is appropriately adjusted (controlled) to adjust the inner pressure of the process chamber 201 to a pressure ranging from 130 Pa to 3,990 Pa. When the inner pressure of the process chamber 201 is lower than 130 Pa in a case where the $SiH_4$ gas is used as the third reducing gas and the $TiCl_4$ gas is used as the second element-containing gas, silicon contained in the $SiH_4$ gas may enter a titanium-containing layer serving as the second element-containing layer, and a concentration of silicon contained in a TiN film to be formed may become high. As a result, a TiSiN film may be formed instead of the TiN film. Similarly, when the inner pressure of the process chamber 201 is higher than 3,990 Pa, silicon contained in the $SiH_4$ gas may enter the titanium-containing layer serving as the second element-containing layer, and the concentration of silicon contained in the TiN film to be formed may become high. As a result, the TiSiN film may be formed instead of the TiN film. As described above, when the inner pressure of the process chamber 201 is too low or too high, a composition of the film to be formed may change.

<Third Reducing Gas Supply Step (Eleventh Step)>

In the eleventh step, the supply of the second element-containing gas is stopped and the third reducing gas alone is supplied into the process chamber 201 in the same manner as the supply of the third reducing gas in the third step of the seed layer forming step described above. In the eleventh step, it is possible to remove the reaction by-products generated while the second element-containing gas is supplied in the ninth step during the second or later performance of the second layer forming cycle. As a result, it is possible to increase the adsorption sites of an element such as the second element. Thereby, it is possible to improve the coverage rate.

<Purge Step (Twelfth Step)>

As the purge step (twelfth step), an inert gas supply step (first sub-step of the twelfth step), an exhaust step (second sub-step of the twelfth step) and an inert gas supply step (third sub-step of the twelfth step) are sequentially performed in order in the same manner as the inert gas supply step (first sub-step of the fourth step), the exhaust step (second sub-step of the fourth step) and the inert gas supply step (third sub-step of the fourth step) of the fourth step of the seed layer forming step described above.

In the twelfth step, the inert gas serves as the purge gas. In the twelfth step, a residual gas in the process chamber 201 such as the second element-containing gas and the third reducing gas which did not react or which contributed to the formation of the second element-containing layer is removed from the process chamber 201. When the $SiH_4$ gas is used as the third reducing gas, the HCl serving as a growth inhibitor reacts with the $SiH_4$ to generate the $SiCl_4$ and the $H_2$ in the process chamber 201, and the generated $SiCl_4$ and $H_2$ are exhausted from the process chamber 201 in the twelfth step.

<Second Reducing Gas Supply and Purge Step (Thirteenth Step)>

Subsequently, as the second reducing gas supply and purge step (thirteenth step), a cycle in which a second reducing gas supply step (first sub-step of the thirteenth step) and a purge step (second sub-step of the thirteenth step) are sequentially performed is performed a predetermined number of times (for example, 4 times) in the same manner as the cycle (in which the first reducing gas supply step (first sub-step of the fifth step) and the purge step (second sub-step of the fifth step) are sequentially performed) of the fifth step of the seed layer forming step described above. That is, an inert gas supply step and an exhaust step are sequentially performed in order as the purge step (second sub-step of the thirteenth step) in the same manner as in the purge step (second sub-step of the fifth step). When the $NH_3$ gas is supplied as the second reducing gas to the wafer 200, titanium (Ti) contained in the titanium-containing layer formed on the first layer and nitrogen (N) contained in the $NH_3$ gas are bonded to form a titanium nitride layer (TiN layer) serving as the second layer. The $NH_3$ gas may also be referred to as a nitrogen-containing gas. By performing the cycle, in which the second reducing gas supply step (first sub-step of the thirteenth step) and the purge step (second sub-step of the thirteenth step) are sequentially performed, a predetermined number of times, the second layer of a predetermined thickness is formed on the first layer. That is, the second sub-step of the thirteenth step is performed between each performance and its next performance of the first sub-step of the thirteenth step. In addition, the last performance (which is the fourth performance in the above example) of the second sub-step of the thirteenth step may be omitted because the purge step (fourteenth step) described later overlaps with the last performance of the second sub-step of the thirteenth step.

<Purge Step (Fourteenth Step)>

Subsequently, as the purge step (fourteenth step), a cycle in which an inert gas supply step (first sub-step of the fourteenth step) and an exhaust step (second sub-step of the fourteenth step) are sequentially performed in order is performed a predetermined number of times (for example, four times) in the same manner as the cycle of the purge step (sixth step) in which the inert gas supply step (first sub-step of the sixth step) and the exhaust step (second sub-step of the sixth step) are sequentially performed in order.

That is, in the fourteenth step, a residual gas in the process chamber 201 (such as unreacted portion of the second reducing gas or consumed portion of the second reducing gas which contributed to the formation of the second layer) and the reaction by-products are removed from the process chamber 201. In the fourteenth step, the inert gas serves as the purge gas.

<Performing a Predetermined Number of Times>

By performing (repeatedly performing) the cycle (that is, the second layer forming cycle in which the ninth step through the fourteenth step described above are sequentially performed in order) a predetermined number of times (m times), the second layer of a predetermined thickness is formed on the first layer. For example, m is set to be greater than n. That is, n is set to be smaller than m. That is, the predetermined number of times of the first layer forming cycle in which the first step through the eighth step described above are sequentially performed in order is smaller than the predetermined number of times of the second layer forming cycle in which the ninth step through the fourteenth step described above are sequentially performed in order. In the second layer forming step, for example, when the $TiCl_4$ gas is used as the second element-containing gas, the SiH$_4$ gas is used as the third reducing gas and the NH$_3$ gas is used as the second reducing gas, the TiN film is formed by forming the TiN layer serving as the second layer of the predetermined thickness on the TiSiN layer serving as the first layer.

<After-Purge Step and Returning to Atmospheric Pressure Step>

The inert gas is supplied into the process chamber 201 through the gas supply pipes 510, 520 and 530, and is exhausted through the exhaust pipe 231. The inert gas serves as the purge gas, and the inner atmosphere of the process chamber 201 is purged with the inert gas. Thus, the residual gas in the process chamber 201 or the reaction by-products remaining in the process chamber 201 is removed from the process chamber 201 (after-purge step). Thereafter, the inner atmosphere of the process chamber 201 is replaced with the inert gas (substitution by inert gas), and the inner pressure of the process chamber 201 is returned to the normal pressure (atmospheric pressure) (returning to atmospheric pressure step).

<Boat Unloading and Wafer Discharging Step>

Thereafter, the seal cap 219 is lowered by the boat elevator 115 and the lower end opening of the reaction tube is opened. The boat 217 with the processed wafers 200 charged therein is unloaded out of the reaction tube through the lower end opening of the reaction tube (boat unloading step). Then, the processed wafers 200 are discharged (transferred) out of the boat 217 (wafer discharging step).

Figure 6A:
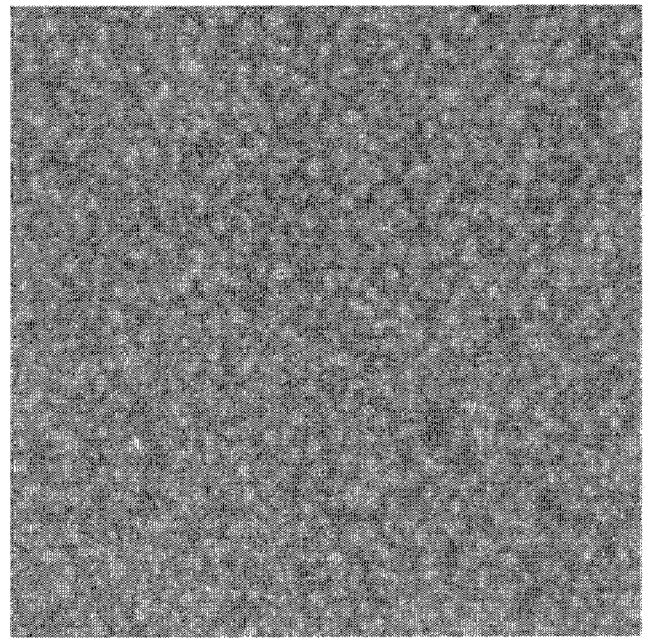
FIG. 6A is a diagram schematically illustrating a TEM image of a surface of a TiN film formed on a substrate by using the substrate processing according to the embodiments described herein.
Figure 6B:
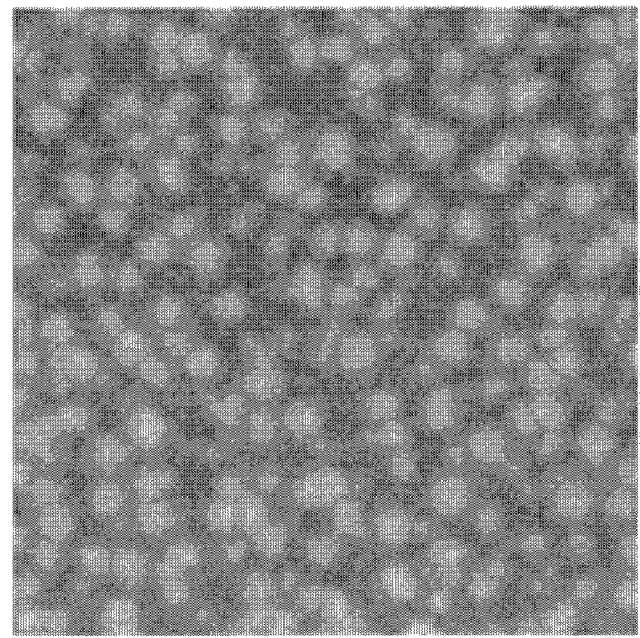
FIG. 6B is a diagram schematically illustrating a TEM image of the surface of the TiN film formed on the substrate according to a comparative example.

FIG. 6A is a diagram schematically illustrating a TEM image of a surface of the TiN film formed on the wafer 200 by using the substrate processing described above. The TEM image of the surface of the TiN film is obtained by projecting the TiN film using a transmission electron microscope (TEM). FIG. 6B is a diagram schematically illustrating a TEM image of the surface of the TiN film according to a comparative example. According to a comparative example, the TiN film is formed on the wafer 200 without forming the seed layer on the wafer 200.

As shown in FIG. 6B, the adsorption of the TiCl$_4$ on the wafer 200 is insufficient in the TiN film formed without the seed layer (TiSiN layer) (that is, the TiN film according to the comparative example). As a result, the coverage rate may be lowered. On the other hand, in the substrate processing according to the present embodiments, after the seed layer is formed by the seed layer forming step, the TiN layer is formed on the seed layer by a TiN layer forming step (that is, the second layer forming step) to form the TiN film. According to the present embodiments, by forming the TiSiN layer whose crystal grain is small and whose density is high and by forming the TiN layer on the TiSiN layer to form the TiN film, as shown in FIG. 6A, it is possible to form the TiN film which is flat and whose density is high. In addition, by sufficiently adsorbing the TiCl$_4$ on the wafer 200, it is possible to improve the coverage rate. That is, it is possible to form the tungsten film (W film) whose resistance is low on the surface of the TiN film.

(3) Effects According to Present Embodiments

According to the present embodiments, it is possible to provide one or more of the following effects.

(a) It is possible to form the film (for example, the TiN film) which is flat and whose density is high.

(b) It is possible to improve the coverage rate. In addition, for example, it is possible to reduce a resistivity of the W film formed on the TiN film which is flat and whose density is high.

(c) It is possible to increase the adsorption sites of an element such as titanium by removing the reaction by-products serving as the growth inhibitor.

Other Embodiments (Modified Examples)

While the technique is described in detail by way of the embodiments described above, the above-described technique is not limited thereto. The above-described technique may be modified in various ways without departing from the scope thereof. For example, the above-described embodiments are described by way of an example in which the TiSiN layer is formed as the seed layer (first layer) when the TiN film is formed on the wafer 200. However, the above-described technique is not limited thereto. For example, the above-described technique may also be applied when a layer such as a boron silicon nitride (BSiN) layer, a molybdenum silicon nitride (MoSiN) layer and an aluminum nitride (AlN) layer is formed as the seed layer to form a film such as a boron nitride (BN) film and a molybdenum nitride (MoN) film. Even in such a case, it is possible to obtain substantially the same effects according to the embodiments described above.

For example, the above-described embodiments are described by way of an example in which the TiCl$_4$ gas containing titanium serving as the first element is used as the first element-containing gas. However, the above-described technique is not limited thereto. For example, the above-described technique may also be preferably applied when a gas containing one of boron (B) and molybdenum (Mo) as the first element and halogen is used as the first element-containing gas. For example, a gas such as boron trichloride (BCl$_3$) gas, diborane (B$_2$H$_6$) gas, molybdenum dichloride dioxide (MoO$_2$Cl$_2$) gas, molybdenum pentoxide (MoCl$_5$), molybdenum tetrachloride oxide (MoOCl$_4$), trimethyl aluminum ((CH$_3$)$_3$Al) and aluminum chloride (AlCl$_3$) may be used as the first element-containing gas.

For example, the above-described embodiments are described by way of an example in which the TiCl$_4$ gas containing titanium serving as the second element is used as the second element-containing gas. However, the above-described technique is not limited thereto. For example, the above-described technique may also be preferably applied when the gas containing one of boron (B) and molybdenum (Mo) as the second element and halogen is used as the second element-containing gas. For example, a gas such as boron trichloride (BCl$_3$) gas, diborane (B$_2$H$_6$) gas, molybdenum dichloride dioxide (MoO$_2$Cl$_2$) gas, molybdenum pentoxide (MoCl$_5$), molybdenum tetrachloride oxide (MoOCl$_4$), trimethyl aluminum ((CH$_3$)$_3$Al) and aluminum chloride (AlCl$_3$) may be used as the second element-containing gas.

That is, the first element of the first element-containing gas and the second element of the second element-containing gas may be the same or may be different.

For example, the above-described embodiments are described by way of an example in which the NH$_3$ gas is used as the first reducing gas in the seed layer forming step and the second reducing gas in the TiN layer forming step. However, the above-described technique is not limited thereto.

For example, the above-described technique may also be applied when the first reducing gas in the seed layer forming step and the second reducing gas in the TiN layer forming step are different.

For example, the above-described embodiments are described by way of an example in which the SiH$_4$ gas is used as the silicon-containing gas. However, the above-described technique is not limited thereto. For example, the above-described technique may also be preferably applied when the silane-based gas other than the SiH$_4$ gas or the chlorosilane-based gas such as the hexachlorodisilane (Si$_2$Cl$_6$) gas is used as the silicon-containing gas.

For example, the above-described embodiments are described by way of an example in which a batch type substrate processing apparatus configured to simultaneously process a plurality of substrates is used to perform the substrate processing (film-forming process). However, the above-described technique is not limited thereto. For example, the above-described technique may be applied when a single wafer type substrate processing apparatus configured to process one or several substrates at a time is used to perform substrate processing (film-forming process).

Figure 7A:
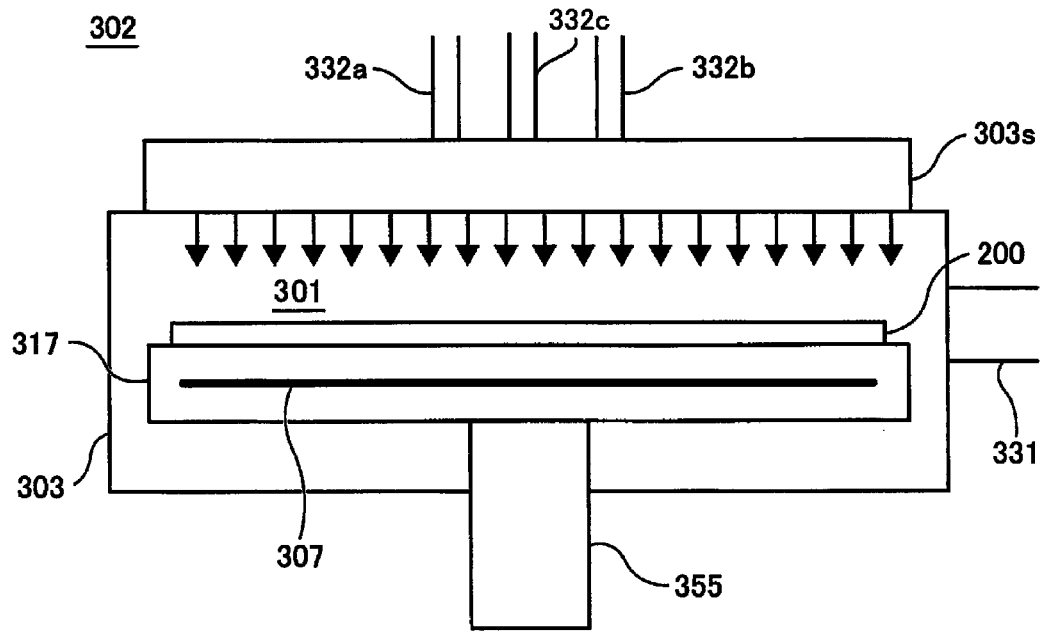
FIG. 7A is a diagram schematically illustrating a vertical cross-section of a process furnace of a substrate processing apparatus according to another embodiment described herein.

For example, the above-described technique may be preferably applied when a film is formed by using a substrate processing apparatus including a process furnace 302 shown in FIG. 7A. The process furnace 302 may include: a process vessel 303 defining a process chamber 301 therein; a shower head 303s configured to shower (supply or diffuse) a gas into the process chamber 301; a support plate 317 configured to support one or several wafers 200 in a horizontal orientation; a rotating shaft 355 configured to support the support plate 317 from thereunder; and a heater 307 provided in the support plate 317. A gas supply port 332a through which the source gas described above is supplied, a gas supply port 332b through which a reactive gas is supplied and a gas supply port 332c through which a gas such as an oxygen-containing gas, the silicon-containing gas and a halogen-containing gas is supplied are connected to an inlet (gas introduction port) of the shower head 303s. A source gas supplier similar to the source gas supplier described above is connected to the gas supply port 332a. A reactive gas supplier similar to the reducing gas supplier described above is connected to the gas supply port 332b. A gas supplier similar to the silicon-containing gas supplier described above is connected to the gas supply port 332c. A gas distribution plate (not shown) configured to shower the gas into the process chamber 301 is provided at an outlet (gas discharge port) of the shower head 303s. An exhaust port 331 through which an inner atmosphere of the process chamber 301 is exhausted is provided at the process vessel 303. An exhauster (not shown) similar to that of the embodiments described above is connected to the exhaust port 331.

Figure 7B:
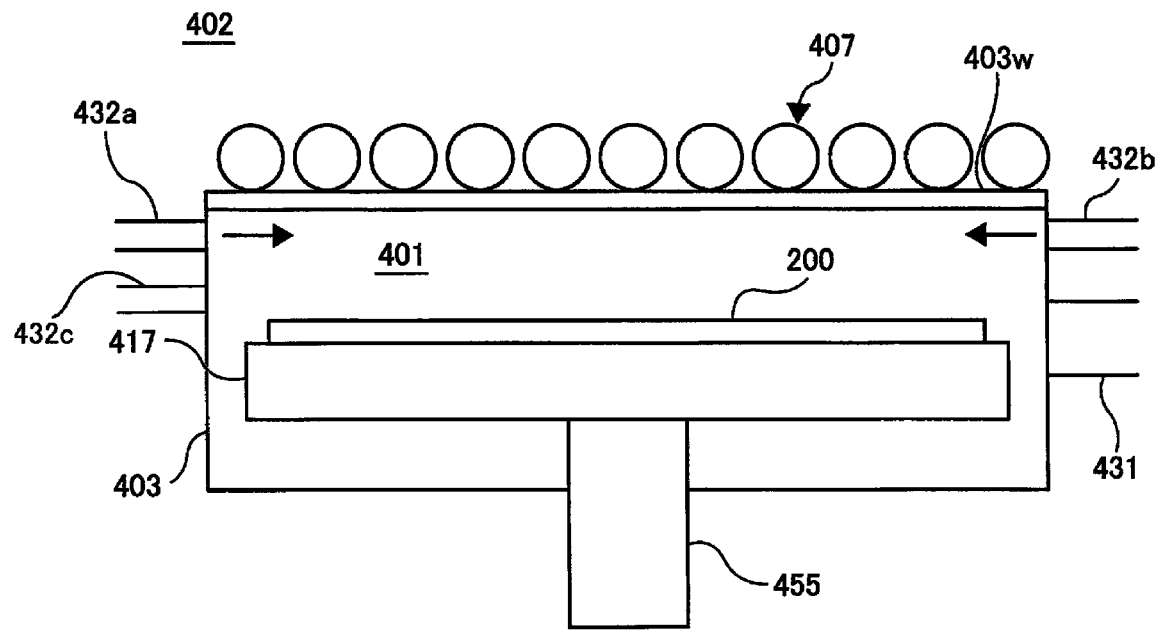
FIG. 7B is a diagram schematically illustrating a vertical cross-section of a process furnace of a substrate processing apparatus according to still another embodiment described herein.

For example, the above-described technique may be preferably applied when a film is formed by using a substrate processing apparatus including a process furnace 402 shown in FIG. 7B. The process furnace 402 may include: a process vessel 403 defining a process chamber 401; a support plate 417 configured to support one or several wafers 200 in a horizontal orientation; a rotating shaft 455 configured to support the support plate 417 from thereunder; a lamp heater 407 configured to irradiate light to the wafer 200 or the wafers 200 in the process vessel 403; and a quartz window 403w through which the light of the lamp heater 407 is transmitted. A gas supply port 432a through which the source gas described above is supplied, a gas supply port 432b through which the reactive gas described above is supplied and a gas supply port 432c through which a gas such as the oxygen-containing gas, the silicon-containing gas and the halogen-containing gas is supplied are connected to the process vessel 403. A source gas supplier similar to the source gas supplier described above is connected to the gas supply port 432a. A reactive gas supplier similar to the reducing gas supplier described above is connected to the gas supply port 432b. A gas supplier similar to the silicon-containing gas supplier described above is connected to the gas supply port 432c. An exhaust port 431 through which an inner atmosphere of the process chamber 401 is exhausted is provided at the process vessel 403. An exhauster (not shown) similar to that of the embodiments described above is connected to the exhaust port 431.

When the substrate processing apparatus of the modified examples described above is used to perform the substrate processing (film-forming process), the processing sequences and the processing conditions of the modified examples described above may be substantially the same as those of the above-described embodiments.

It is preferable that the process recipe (that is, a program defining parameters such as processing sequences and processing conditions of the substrate processing) used to form the above-described various films is prepared individually according to the contents of the substrate processing such as a type of the film to be formed, a composition ratio of the film, a quality of the film, a thickness of the film, the processing sequences and the processing conditions of the substrate processing. That is, a plurality of process recipes are prepared. When starting the substrate processing, an appropriate process recipe is preferably selected among the plurality of process recipes according to the contents of the substrate processing. Specifically, it is preferable that the plurality of process recipes are stored (installed) in the memory 121c of the substrate processing apparatus 10 in advance via an electric communication line or the recording medium (the external memory device 123) storing the plurality of process recipes. Then, when starting the substrate processing, the CPU 121a preferably selects the appropriate process recipe among the plurality of process recipes stored in the memory 121c of the substrate processing apparatus 10 according to the contents of the substrate processing. Thus, various films of different types, composition ratios, different qualities and different thicknesses may be universally formed with the high reproducibility using a single substrate processing apparatus. In addition, since the burden on the operator such as inputting the processing sequences and the processing conditions may be reduced, various processes may be performed quickly while avoiding a malfunction of the apparatus.

The above-described technique may be implemented by changing an existing process recipe stored in the substrate processing apparatus to a new process recipe. When changing the existing process recipe to the new process recipe, the new process recipe may be installed in the substrate processing apparatus via the electric communication line or the recording medium storing the plurality of process recipes. The existing process recipe already stored in the substrate processing apparatus may also be directly changed to the new process recipe according to the above-described technique by operating the input/output device of the substrate processing apparatus.

The above-described technique may be applied to, for example, a word line of a component such as a NAND flash memory and a DRAM of a three-dimensional structure.

As described above, the technique is described in detail by way of the embodiments and the modified examples. However, the above-described technique is not limited thereto. The above-described embodiments and the examples may be appropriately combined.

Example of Embodiments

Hereinafter, examples according to the embodiments described above will be described.

Using the substrate processing apparatus 10 described above, a sample #1 through a sample #4 are prepared. As the sample #1 through the sample #4, a TiN film of a thickness of 20 Å wherein a ratio of a thickness of the TiSiN layer to a thickness of the TiN layer varies among the sample #1 through #4 is formed on each of the silicon substrates by the substrate processing shown in FIGS. 4 and 5. FIGS. 8A through 8D are diagrams schematically illustrating cross-sections of the sample #1 through the sample #4 (that is, cross-sections of the silicon substrates) when the ratios of the TiN layer in the TiN film formed on the silicon substrates are 100%, 75%, 50% and 25%, respectively, and FIGS. 8E through 8F are diagrams schematically illustrating TEM images of the surfaces of the TiN films of the sample #1 through the sample #4 shown in FIGS. 8A through 8D, respectively, obtained by projecting the TiN films using the transmission electron microscope (TEM).

As shown in FIGS. 8E through 8H, it is confirmed that a density of each TiN film of the sample #2, the sample #3 and the sample #4 is higher than that of the sample #1, and that the TiN film of each of the sample #2, the sample #3 and the sample #4 is flatter as compared with the sample #1. That is, it is confirmed that a density of the TiN film in which the TiN layer is formed on the TiSiN layer is higher than that of the TiN film in which the TiSiN layer is not formed, and that the TiN film in which the TiN layer is formed on the TiSiN layer is flatter as compared with the TiN film in which the TiSiN layer is not formed. Furthermore, it is confirmed that the density of the TiN film of each of the sample #3 and the sample #4 is higher than that of the sample #2, and that the TiN film of each of the sample #3 and the sample #4 is flatter as compared with the sample #2. That is, it is confirmed that a flatness of the TiN film depends on the thickness of the TiSiN layer. It is also confirmed that, when forming the TiN film of a thickness of 20 Å, by setting the thickness of the TiSiN layer to 5 Å or more, more preferably 10 Å or more, it is possible to form the TiN film which is flat and whose density is high.

That is, it is confirmed that, when forming the TiN film on the wafer 200, by forming the seed layer and by forming the TiN layer on the seed layer, it is possible to form the TiN film which is flat and whose density is high.

As described above, according to some embodiments in the present disclosure, it is possible to form a sufficiently flat film.

What is claimed is:

1. A substrate processing method, comprising
   (a) forming a first layer containing silicon on a substrate by performing a first layer forming cycle once or more, wherein the first layer forming cycle comprises:
   (a1) supplying a first element-containing gas containing a first element other than silicon to the substrate; and
   (a2) supplying a first reducing gas to the substrate a plurality of times;
   (a') supplying a first silicon-containing gas to the substrate,
   wherein (a1) and (a2) are sequentially performed in the first layer forming cycle; and
   (b) forming a second layer on the first layer by performing a second layer forming cycle once or more after (a), wherein the second layer forming cycle comprises:
   (b1) supplying a second element-containing gas to the substrate; and
   (b2) supplying a second reducing gas to the substrate, wherein (b1) and (b2) are sequentially performed in the second layer forming cycle.

2. The method of claim 1, wherein (a') is started while (a1) is performed.

3. The method of claim 1, wherein (a') is performed after (a1) is completed.

4. The method of claim 2, wherein (a') continues to be performed after (a1) is completed.

5. The method of claim 1, wherein (a') is performed after (a2) is completed.

6. The method of claim 1, wherein the first layer forming cycle further comprises
   (a5) purging a space where the substrate is accommodated during a time interval between each of the times of supplying the first reducing gas and a next time of supplying the first reducing gas in (a2).

7. The method of claim 6, wherein (a5) comprises:
   (a51) supplying an inert gas to the substrate; and
   (a52) exhausting the space,
   wherein (a51) and (a52) are sequentially performed in (a5).

8. The method of claim 1, wherein the first layer forming cycle further comprises
   (a6) performing a sub-cycle a plurality of times after (a2), wherein the sub-cycle comprises:
   (a61) supplying an inert gas to the substrate; and
   (a62) exhausting a space where the substrate is accommodated.

9. The method of claim 1, wherein the second layer forming cycle further comprises
   (b3) supplying a second silicon-containing gas to the substrate,
   wherein (b3) is started while (b1) is performed.

10. The method of claim 1, wherein the second layer forming cycle further comprises
    (b3) supplying a second silicon-containing gas to the substrate,
    wherein (b3) is performed after (b1) is completed.

11. The method of claim 9, wherein (b3) continues to be performed after (b1) is completed.

12. The method of claim 1, wherein the first layer forming cycle is repeatedly performed in (a) until a thickness of the first layer is equal to or greater than 5 Å.

13. The method of claim 1, wherein the first element contained in the first element-containing gas is same as a second element contained in the second element-containing gas.

14. The method of claim 1, wherein the first element contained in the first element-containing gas is different from a second element contained in the second element-containing gas.

15. The method of claim 1, wherein the number of times of performing the first layer forming cycle in (a) is smaller than the number of times of performing the second layer forming cycle in (b).

16. A substrate processing apparatus, comprising:
    a gas supplier configured to supply a first element-containing gas containing a first element other than silicon, a first reducing gas, a first silicon-containing gas, a second element-containing gas and a second reducing gas to a substrate; and
    a controller configured to be capable of controlling the gas supplier to perform:
    (a) forming a first layer containing silicon on the substrate by performing a first layer forming cycle once or more, wherein the first layer forming cycle comprises:

(a1) supplying the first element-containing gas to the substrate; and (a2) supplying the first reducing gas to the substrate a plurality of times;

(a') supplying the first silicon-containing gas to the substrate, wherein (a1) and (a2) are sequentially performed in the first layer forming cycle; and (b) forming a second layer on the first layer by performing a second layer forming cycle once or more after (a), wherein the second layer forming cycle comprises:

(b1) supplying the second element-containing gas to the substrate; and (b2) supplying the second reducing gas to the substrate, wherein (b1) and (b2) are sequentially performed in the second layer forming cycle.

17. A non-transitory computer-readable recording medium storing a program that causes, by a computer, a substrate processing apparatus to perform:

(a) forming a first layer containing silicon on a substrate by performing a first layer forming cycle once or more, wherein the first layer forming cycle comprises:

(a1) supplying a first element-containing gas containing a first element other than silicon to the substrate; and (a2) supplying a first reducing gas to the substrate a plurality of times;

(a') supplying a first silicon-containing gas to the substrate, wherein (a1) and (a2) are sequentially performed in the first layer forming cycle; and (b) forming a second layer on the first layer by performing a second layer forming cycle once or more after (a), wherein the second layer forming cycle comprises:

(b1) supplying a second element-containing gas to the substrate; and (b2) supplying a second reducing gas to the substrate, wherein (b1) and (b2) are sequentially performed in the second layer forming cycle.

18. The method of claim 1, wherein the second layer is free of silicon.

19. A method of manufacturing a semiconductor device, comprising forming the semiconductor device by performing the method of claim 1.

* * * * *